(12) United States Patent
Jeon (10) Patent No.: US 9,851,405 B2
(45) Date of Patent: Dec. 26, 2017

(54) METHOD AND APPARATUS FOR DETECTING STATE OF RELAY

(71) Applicant: Samsung Electronics Co., Ltd., Suwon-si (KR)

(72) Inventor: Jinyong Jeon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 14/573,833

(22) Filed: Dec. 17, 2014

(65) Prior Publication Data

US 2015/0346282 A1 Dec. 3, 2015

(30) Foreign Application Priority Data

May 30, 2014 (KR) .................... 10-2014-0065960

(51) Int. Cl.
*G01R 31/327* (2006.01)
*G01R 1/20* (2006.01)
*G01R 1/30* (2006.01)

(52) U.S. Cl.
CPC ................ *G01R 31/3278* (2013.01)

(58) Field of Classification Search
CPC  G01R 31/327; G01R 1/30; G01R 1/20; H02J 7/0031
USPC ................ 324/415, 418, 426, 433
See application file for complete search history.

(56) References Cited

U.S. PATENT DOCUMENTS

| 7,368,829 B2 * | 5/2008 | Tezuka ................. H01H 47/002 307/9.1 |
| 2010/0194354 A1 | 8/2010 | Gotou et al. |
| 2010/0277960 A1 * | 11/2010 | Cottingham ............ H02M 7/06 363/126 |
| 2010/0296204 A1 * | 11/2010 | Ichikawa et al. ........ H02H 7/16 361/15 |
| 2011/0084704 A1 * | 4/2011 | Myoen ...................... B60L 3/12 324/538 |
| 2013/0285470 A1 * | 10/2013 | Koyama ................ H03K 17/56 307/112 |
| 2014/0333311 A1 * | 11/2014 | Liu ....................... G01R 31/327 324/418 |

FOREIGN PATENT DOCUMENTS

| EP | 0 946 956 B1 | 2/2002 | |
| JP | 2000-270561 A | 9/2000 | |
| JP | 2006-310219 | * 5/2005 | ............ H01H 47/00 |
| JP | 2006-310219 A | 11/2006 | |
| JP | 5164806 B2 | 3/2013 | |
| JP | 2013-145735 A | 7/2013 | |
| KR | 10-1241226 B1 | 3/2013 | |
| KR | 10-2013-0039817 A | 4/2013 | |
| KR | 10-2013-0096481 A | 8/2013 | |
| KR | 10-2013-0119666 A | 11/2013 | |

* cited by examiner

*Primary Examiner* — Arleen M Vazquez
*Assistant Examiner* — Neel Shah
(74) *Attorney, Agent, or Firm* — NSIP Law (57) ABSTRACT

An apparatus for detecting a state of a relay includes a voltage outputter configured to output a voltage having a different voltage value for each state of each of a plurality of relays configured to switch a connection between a battery and a load, and a controller configured to determine whether each of the plurality of relays is welded based on the voltage output from the voltage outputter.

16 Claims, 6 Drawing Sheets

METHOD AND APPARATUS FOR DETECTING STATE OF RELAY

CROSS-REFERENCE TO RELATED APPLICATIONS

This application claims the benefit under 35 USC 119(a) of Korean Patent Application No. 10-2014-0065960 filed on May 30, 2014, in the Korean Intellectual Property Office, the entire disclosure of which is incorporated herein by reference for all purposes.

BACKGROUND

1. Field

This description relates to a method and an apparatus for detecting a state of a relay.

2. Description of Related Art

While the importance of environmental issues and energy resources is increasing, an electric vehicle is in the spotlight as a future transportation device. The electric vehicle employs, as a main power source, a battery in which a plurality of rechargeable secondary cells is formed as a single pack, and thus no exhaust gas and very small noise may occur.

The battery in the electric vehicle functions as an engine and a fuel tank and thus, it is important to verify a state of the battery for the safety of an electric vehicle user.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for detecting a state of a relay includes a voltage outputter configured to output a voltage having a different voltage value for each state of each of a plurality of relays configured to switch a connection between a battery and a load; and a controller configured to determine whether each of the plurality of relays is welded based on the voltage output from the voltage outputter.

The plurality of relays include a first relay connected to an anode of the battery; a second relay connected to a cathode of the battery; and a third relay connected in series with an auxiliary resistance, with the series-connected third relay and auxiliary resistance being connected in parallel with the first relay.

The voltage outputter may include an operational amplifier; and a plurality of resistances connected to an inverting terminal and a non-inverting terminal of the operational amplifier, and the voltage outputter may be further configured to output the voltage from an output terminal of the operational amplifier.

The plurality of resistances may include a first resistance connected between the inverting terminal and a point where the first relay and the third relay are connected to each other; a second resistance connected between the inverting terminal and the output terminal of the operational amplifier; a third resistance connected between the non-inverting terminal and an external power source; a fourth resistance connected between the second relay and the non-inverting terminal; and a fifth resistance connected between a ground and a point where the first relay, the third relay, and the first resistance are connected to each other.

The voltage outputter may be further configured to apply a voltage of the external power source to the first resistance, the second resistance, and the fifth resistance in response to the first relay through the third relay being in an OFF state; and output, from the output terminal of the operational amplifier, a differential voltage between the voltage of the external power source and a voltage applied to the second resistance.

The voltage outputter may be further configured to apply a voltage of the external power source to the first through fifth resistances in response to the second relay being in an OFF state; and output, from the output terminal of the operational amplifier, a differential voltage between a voltage applied to the fourth resistance and a voltage applied to the second resistance.

The voltage outputter may be further configured to apply a voltage of the battery and a voltage of the external power source to the first through fifth resistances and the auxiliary resistance in response to the second relay and the third relay being in an ON-state and the first relay being in an OFF-state; and output, from the output terminal of the operational amplifier, a differential voltage between a voltage applied to the fourth resistance and a voltage applied to the second resistance.

The voltage outputter may be further configured to apply a voltage of the battery and a voltage of the external power source to the first through fourth resistances in response to the first relay and the second relay being in an ON-state and the third relay being in an OFF-state; and output, from the output terminal of the operational amplifier, a differential voltage between a voltage applied to the fourth resistance and a voltage applied to the second resistance.

A voltage value of the external power source may be equal to a voltage value of the battery.

The apparatus may further include a voltage transmitter configured to transmit the voltage output from the voltage outputter to the controller.

The apparatus may further include a voltage adjuster configured to adjust the voltage output from the voltage outputter to be a voltage that can be input to the voltage transmitter.

The apparatus may further include an isolator configured to electrically separate the voltage transmitter and the controller from each other; and the voltage transmitter may be further configured to transmit the voltage output from the voltage outputter to the controller via the isolator.

The controller may be further configured to determine whether each of the plurality of relays is welded by comparing the voltage output from the voltage outputter to predetermined reference information.

The controller may be further configured to control each of the plurality of relays to switch a connection between each of the plurality of relays and the voltage outputter; and the voltage outputter may be further configured to output the voltage having the different voltage value for each state of each of the plurality of relays based on the connection between each of the plurality of relays and the voltage outputter.

The controller may be further configured to transmit information on a welding state of each of the plurality of relays outside the apparatus.

In another general aspect, a method of detecting a state of a relay includes detecting a voltage having a different voltage value for each state of each of a plurality of relays configured to switch a connection between a battery and a load; and determining whether each of the plurality of relays is welded based on the detected voltage.

The plurality of relays may include a first relay connected to an anode of the battery; a second relay connected to a cathode of the battery; and a third relay connected in series with an auxiliary resistance, with the series-connected third relay and auxiliary resistance being connected in parallel with the first relay.

The determining may include determining whether each of the plurality of relays is welded by comparing the detected voltage to predetermined reference information.

In another general aspect, a non-transitory computer-readable storage medium stores a program including instructions to cause a computer to perform the method described above.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements, and repeated descriptions of the same element may be omitted. The drawings may not be to scale, and the relative size, proportions, and depiction of elements in the drawings may be exaggerated for clarity, illustration, and convenience.

The terminology used herein is for the purpose of describing particular embodiments only, and is not to be limiting of the embodiments. As used herein, the singular forms "a", "an", and "the" are intended to include the plural forms as well, unless the context clearly indicates otherwise. It will be further understood that the terms "include/comprise" and/or "have" when used in this specification specify the presence of stated features, numbers, operations, elements, components, and/or combinations thereof, but do not preclude the presence or addition of one or more other features, numbers, operations, elements, components, and/or combinations thereof.

Unless otherwise defined, all terms, including technical and scientific terms, used herein have the same meaning as commonly understood by one of ordinary skill in the art to which the description pertains. It will be further understood that terms, such as those defined in commonly-used dictionaries, should be interpreted as having a meaning that is consistent with their meaning in the context of the relevant art, and will not be interpreted in an idealized or overly formal sense unless expressly so defined herein.

Figure 1:
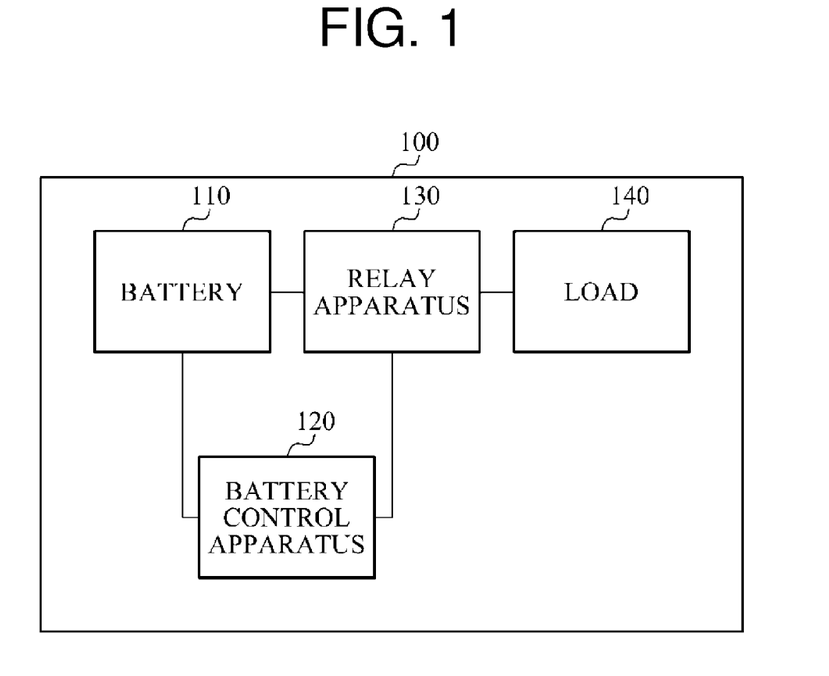
FIG. 1 illustrates an example of a battery system.

FIG. 1 illustrates an example of a battery system 100.

Referring to FIG. 1, the battery system 100 includes a battery 110, a battery control apparatus 120, a relay apparatus 130, and a load 140.

The battery 110 supplies power to a transportation device, for example, an electric vehicle or an electric bicycle, equipped with the battery system 100, and includes a plurality of battery modules. In one example, the plurality of battery modules may be secondary cells, such as a lithium ion battery, for example. The plurality of battery modules may have the same capacity or voltage, or may have different capacities or voltages. The battery system 100 may be referred to as an energy storage system (ESS).

The battery control apparatus 120 monitors a state of the battery 110 and controls the battery 110. The battery control apparatus 120 may be referred to as a battery management system (BMS). In one example, the battery control apparatus 120 controls a temperature of the plurality of battery modules included in the battery 110. Also, the battery control apparatus 120 may prevent overcharging and over-discharging of the plurality of battery modules, and may control charging states of the plurality of battery modules to be the same through cell balancing. Accordingly, the energy efficiency of the plurality of battery modules may be enhanced, and the lifespan of the plurality of battery modules may be extended.

The battery control apparatus 120 estimates a state of health (SoH), a state of charge (SoC), and a state of function (SoF) of the battery 110. The state of health indicates a degraded level of performance of the battery 110 compared to a level performance of the battery 110 when the battery 110 was new, the state of charge indicates information on an amount of charge received in the battery 110, and the state of function indicates information on a matching level between the performance of the battery 110 and a predetermined condition.

The battery control apparatus 120 provides the state of health, the state of charge, and the state of function to an electronic control unit (ECU). In one example, the battery control apparatus 120 communicates with the ECU through controller area network (CAN) communication.

The plurality of battery modules included in the battery 110 are connected to each other in series. For example, a first battery module and a second battery module are connected in series. One end of the battery 110 is an anode, and the other end of the battery 110 is a cathode.

The relay apparatus 130 controls power supply from the battery 110 to the load 140 by switching a connection between the battery 110 and the load 140, that is, by connecting the battery 110 to the load 140, and disconnecting the battery 110 from the load 140. For example, when an ignition key of a transportation device equipped with the battery system 100 is in an ON-state, the relay apparatus 130 connects the battery 110 to the load 140. Accordingly, the battery 110 is discharged and power is supplied to the load 140. When the ignition key of the transportation device is in an OFF-state, the relay apparatus 130 disconnects the battery 110 from the load 140. In another example, in response to a malfunction of the battery 110, for example, in response to an occurrence of an overcurrent in the battery 110, the relay apparatus 130 disconnects the battery 110 from the load 140. The relay apparatus 130 is controlled by the battery control apparatus 120, and includes a plurality of relays.

The battery control apparatus 120 detects a state of the relay apparatus 130. For example, in response to an overvoltage or an overcurrent applied to the plurality of relays included in the relay apparatus 130, one or more of the plurality of relays may be welded. That is, contacts of one or more of the plurality of relays may be welded together. A welded relay cannot perform a switching operation, and thus cannot disconnect the battery 110 from the load 140 to cut off a supply of power from the battery 110 to the load 140. Accordingly, in response to a malfunction of the battery 110, the relay apparatus 130 cannot disconnect the battery 110 from the load 140, and the overvoltage or the overcurrent may be applied to the load 140.

Figure 2:
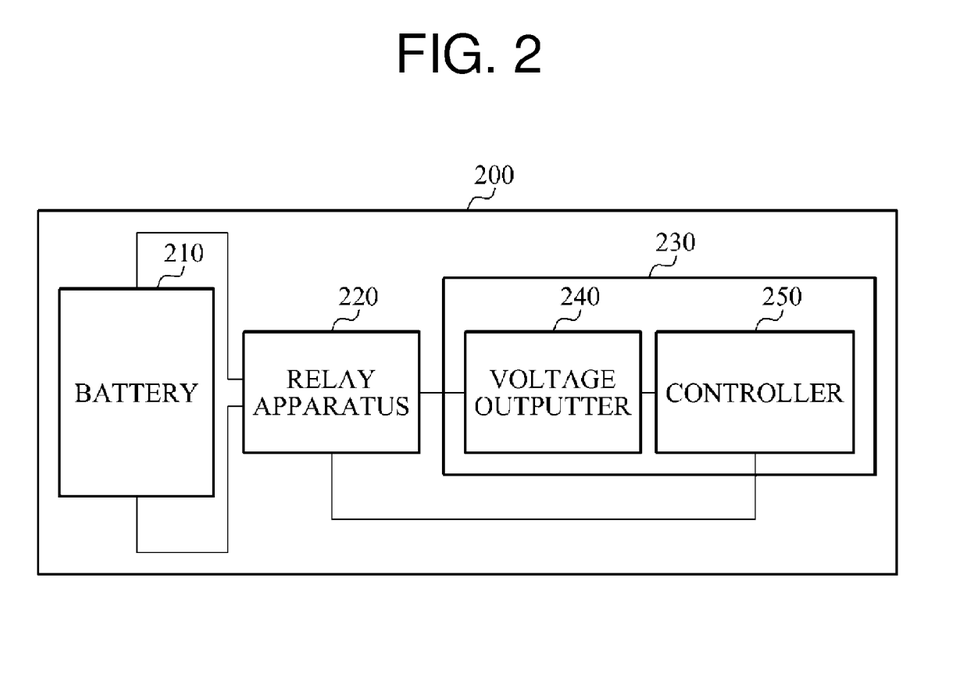
FIG. 2 illustrates an example of a battery system including a relay state detecting apparatus.

FIG. 2 illustrates an example of a battery system 200 including a relay state detecting apparatus 230.

Referring to FIG. 2, the battery system 200 includes a battery 210, a relay apparatus 220, and the relay state detecting apparatus 230. The relay state detecting apparatus 230 includes a voltage outputter 240 and a controller 250.

The battery 210 supplies power to a transportation device equipped with the battery system 200. In one example, the battery 210 includes a plurality of battery modules, and each of the plurality of battery modules includes a plurality of cells. The plurality of cells are connected to each other in series. One end of the battery 210 is an anode, and the other end of the battery 210 is a cathode.

The relay apparatus 220 controls power supply from the battery 210 to a load (not shown) by switching a connection between the battery 210 and the load, that is, by connecting the battery 210 to the load, and disconnecting the battery 210 from the load. Accordingly, the relay apparatus 220 is able to stably supply the power to the load. The relay apparatus 220 includes a plurality of relays. The plurality of relays include a first relay connected to an anode of the battery 210, a second relay connected to a cathode of the battery 210, and a third relay connected in series with an auxiliary resistance, with the series-connected third relay and auxiliary resistance being connected in parallel with the first relay. In one example, the relay apparatus 220 is a relay assembly, the first relay and the second relay are main relays, and the third relay is a pre-charge relay.

The controller 250 controls the plurality of relays. For example, when an ignition key of a transportation device equipped with the battery system 200 is in an ON-state, the controller 250 switches ON the second relay and the third relay, and switches OFF the first relay and maintains the first relay in an OFF-state to perform pre-charging. In response to switching ON the third relay, a voltage of the battery 210 is applied to the auxiliary resistance connected in series with the third relay, and a voltage supplied to the load is lower than the voltage supplied from the battery 210. The controller 250 switches ON the first relay and switches OFF the third relay. Accordingly, a relatively high voltage compared to a case in which the third relay is in an ON-state is supplied to the load.

The voltage outputter 240 outputs a voltage having a different voltage value for each state of each of the plurality of relays. In one example, the voltage outputter 240 includes an operational amplifier, and a plurality of resistances connected to an inverting terminal or a non-inverting terminal of the operational amplifier. The voltage outputter 240 outputs the voltage at an output terminal of the operational amplifier.

The operational amplifier and the plurality of resistances are connected to the plurality of relays, and a voltage applied to the plurality of resistances and a voltage output from the output terminal of the operational amplifier varies based on the state of each of the plurality of relays. For example, in each of a case in which the first through third relays are in an OFF-state and a case in which the first relay and the second relay are in an ON-state and the third relay is in an OFF-state, a voltage applied to the plurality of resistances will vary. Accordingly, the voltage output from the output terminal of the operational amplifier will also vary.

The controller 250 switches a connection between each of the plurality of relays and the voltage outputter 240 by controlling the plurality of relays. Accordingly, the voltage outputter 240 outputs a voltage value that varies based on the connection between each of the plurality of relays and the voltage outputter 240.

The controller 250 determines whether each of the plurality of relays is welded based on the voltage output from the voltage outputter 240. The voltage value output from the voltage outputter 240 varies based on the state of each of the plurality of relays, and accordingly the controller 250 determines whether each of the plurality of relays is welded based on the output voltage value. In one example, the controller 250 determines whether each of the plurality of relays is welded by comparing the voltage output from the voltage outputter 240 to predetermined reference information. In one example, the predetermined reference information includes information on the state of each of the plurality of relays that maps the voltage output from the voltage outputter 240. For example, the controller 250 includes a lookup table that stores information on the state of each of the plurality of relays mapping the voltage output from the voltage outputter 240. The controller 250 detects information on the state of each of the plurality of relays by searching the lookup table using the voltage output from the voltage outputter 240. For example, when the first through third relays are in an OFF-state, a mapping voltage value is stored as 5V in the lookup table, and when the second relay is in an ON-state and the first relay and the third relay are in an OFF-state, a mapping voltage value is stored as 3V in the lookup table. For example, the controller 250 switches OFF the first through third relays by controlling the relay apparatus 220. In this example, a voltage value of the voltage output from the voltage outputter 240 is measured as 3V. Referring to the lookup table, 3V is mapped to a case in which the second relay is in an ON-state and the first relay and the third relay are in an OFF-state. Accordingly, although the controller 250 has switched OFF all of the first through third relays, measuring the voltage value of 3V indicates that the second relay is in a welded state and has not actually been switched OFF. Accordingly, the controller 250 detects that the second relay is in a welded state, and the first relay and the third relay are in a normal state.

In one example, the controller 250 transmits information on a welding of each of the plurality of relays to an external device. For example, the controller 250 transmits information on a welding of each of the plurality of relays to an electronic control unit (ECU) or a motor control unit (MCU).

FIGS. 3A through 3E illustrating an example of a battery control apparatus.

Referring to FIGS. 3A through 3E, a battery system 300 includes a battery 310, a relay apparatus 320, a voltage outputter 330, and a controller 350. In one example, the voltage outputter 330 and the controller 350 are included in the battery control apparatus.

Figure 3A:
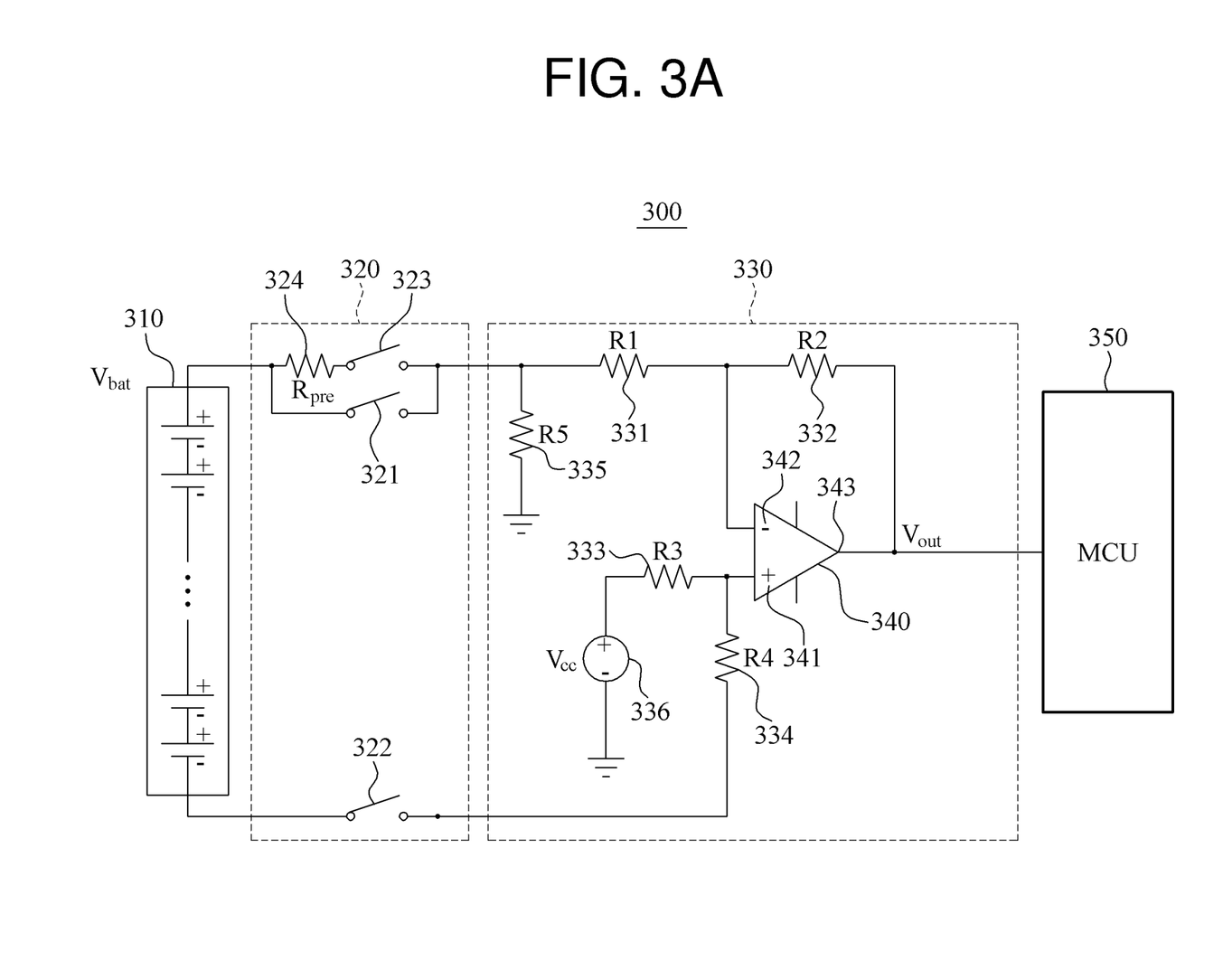
FIGS. 3A through 3E illustrate an example of a battery control apparatus.

The battery 310 includes a plurality of cells, and the plurality of cells are connected to each other in series. An upper end of the battery 310 is an anode, and a lower end of the battery 310 is a cathode. The relay apparatus 320 switches a connection between the battery 310 and a load (not shown), that is, connects the battery 310 to the load, and disconnects the battery 310 from the load. The relay apparatus 320 includes a first relay 321, a second relay 322, and a third relay 323. The first relay 321 is connected to the anode of the battery 310, and the second relay 322 is connected to the cathode of the battery 310. The third relay 323 is connected in series with an auxiliary resistance 324 ($R_{pre}$), and the series-connected third relay 323 and auxiliary resistance 324 are connected in parallel with the first relay 321. The auxiliary resistance 324 is connected between the anode of the battery 310 and the third relay 323.

The voltage outputter 330 includes an operational amplifier 340 and a plurality of resistances including a first resistance 331 (R1), a second resistance 332 (R2), a third resistance 333 (R3), a fourth resistance 334 (R4), and a fifth resistance 335 (R5). In one example, the first resistance 331 is connected between an inverting terminal 342 of the operational amplifier 340 and a point where the first relay 321 and the third relay 323 are connected to each other, the second resistance 332 is connected between the inverting terminal 342 and an output terminal 343 of the operational amplifier 340, and the third resistance 333 is connected between a non-inverting terminal 341 of the operational amplifier 340 and an external power source 336, for example, a lead storage battery. The fourth resistance 334 is connected between the second relay 322 and the non-inverting terminal 341, and the fifth resistance 335 is connected between a ground and a point where the first relay 321, the third relay 323, and the first resistance 331 are connected to each other. A voltage value $V_{cc}$ of the external power source 336 may be equal to a voltage value $V_{bat}$ of the battery 310.

The voltage outputter 330 outputs a voltage $V_{out}$ having a different voltage value for each state of each of the first relay 321, the second relay 322, and the third relay 323.

Figure 3B:
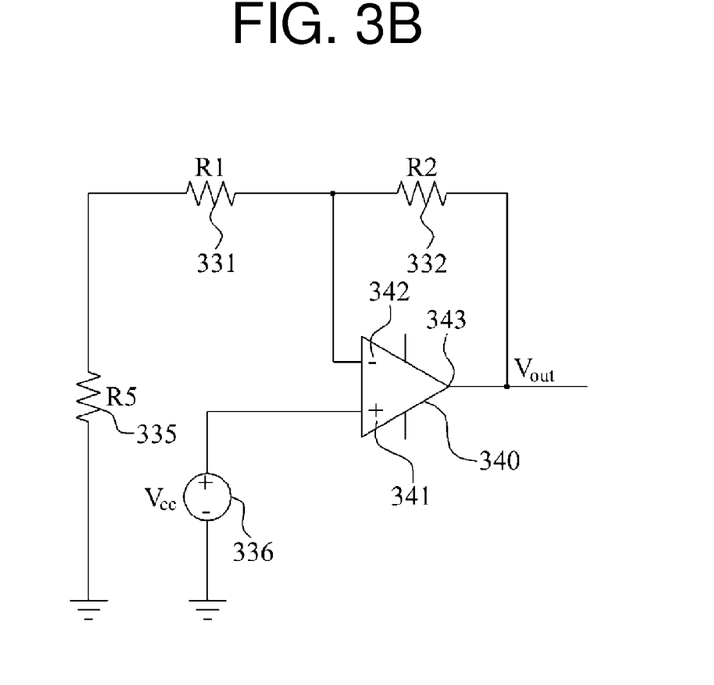

When the first relay 321, the second relay 322, and the third relay 323 are in an OFF-state, the operational amplifier 340 and the plurality of resistances including the first resistance 331, the second resistance 332, the third resistance 333, the fourth resistance 334, and the fifth resistance 335 have an equivalent circuit as shown in FIG. 3B. In this state, the fourth resistance 334 is not grounded, and thus the voltage of the external power source 336 is applied to the first resistance 331, the second resistance 332, and the fifth resistance 335. The operational amplifier 340 outputs a differential voltage between the voltage of the external power source 336 and the voltage applied to the second resistance 332. When the first relay 321, the second relay 322, and the third relay 323 are in an OFF-state, the output voltage $V_{out}$ of the operational amplifier 340 is expressed by Equation 1 below.

$$V_{out} = \left(1 + \frac{R_2}{R_1 + R_5}\right) \times V_{cc} \quad \text{[Equation 1]}$$

In Equation 1, $V_{out}$ denotes the output voltage of the operational amplifier 340, $V_{cc}$ denotes the voltage of the external power source 336, $R_1$ denotes the first resistance 331, $R_2$ denotes the second resistance 332, and $R_5$ denotes the fifth resistance 335.

Figure 3C:
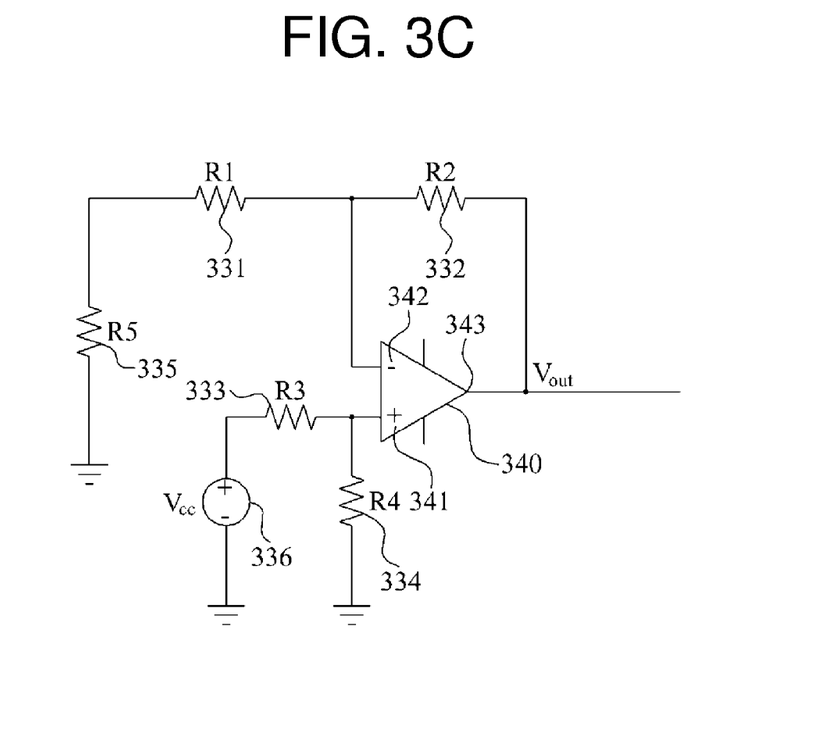

When the second relay 322 is in an ON-state and the first relay 321 and the third relay 323 are in an OFF-state, the operational amplifier 340 and the plurality of resistances including the first resistance 331, the second resistance 332, the third resistance 333, the fourth resistance 334, and the fifth resistance 335 of the voltage outputter 330 have an equivalent circuit as shown in FIG. 3C. In this example, the fourth resistance 334 is connected to the lower end of the battery 310 and thereby grounded. In response thereto, the voltage of the external power source 336 is applied to the first resistance 331, the second resistance 332, the third resistance 333, the fourth resistance 334, and the fifth resistance 335. The operational amplifier 340 outputs a differential voltage between the voltage applied to the fourth resistance 334 and the voltage applied to the second resistance 332. When the second relay 322 is in an ON-state and the first relay 321 and the third relay 323 are in an OFF-state, the output voltage $V_{out}$ of the operational amplifier 340 is expressed by Equation 2 below.

$$V_{out} = \left\{1 + \frac{R_2}{R_1 + R_5}\right\} \times \left\{\frac{R_4}{R_3 + R_4}\right\} \times V_{cc} \quad \text{[Equation 2]}$$

In Equation 2, $V_{out}$ denotes the output voltage of the operational amplifier 340, $V_{cc}$ denotes the voltage of the external power source 336, $R_1$ denotes the first resistance 331, $R_1$ denotes the second resistance 332, $R_3$ denotes the third resistance 333, $R_4$ denotes the fourth resistance 334, and $R_5$ denotes the fifth resistance 335.

Figure 3D:
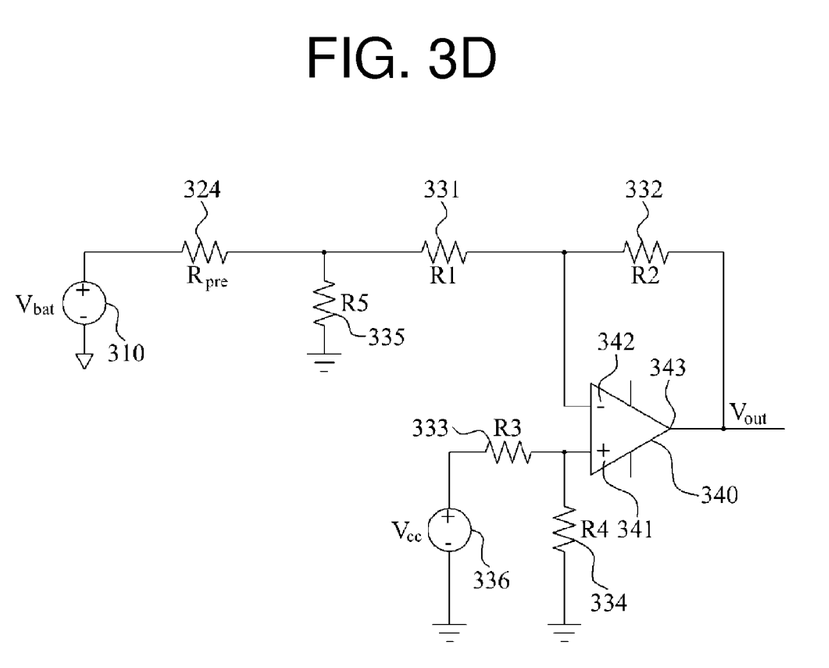

When the second relay 322 and the third relay 323 are in an ON-state and the first relay 321 is in an OFF-state, the operational amplifier 340 and the plurality of resistances including the first resistance 331, the second resistance 332, the third resistance 333, the fourth resistance 334, and the fifth resistance 335 of the voltage outputter 330 have an equivalent circuit as shown in FIG. 3D. In this example, a voltage of the battery 310 is connected to the voltage outputter 330 through the auxiliary resistance 324, and the voltage of the battery 310 and the voltage of the external power source 336 are applied to the first resistance 331, the second resistance 332, the third resistance 333, the fourth resistance 334, the fifth resistance 335, and the auxiliary resistance 324. The operational amplifier 340 outputs a differential voltage between the voltage applied to the fourth resistance 334 and the voltage applied to the second resistance 332. When the second relay 322 and the third relay 323 are in an ON-state and the first relay 321 is in an OFF-state, the output voltage $V_{out}$ of the operational amplifier 340 is expressed by Equation 3 below.

$$V_{out} = \left(\frac{R_1 + R_2}{R_1}\right)\left(\frac{R_4}{R_3 + R_4}\right) V_{CC} - \frac{R_2}{R_1}\left(\frac{R_5}{R_{pre} + R_5}\right) V_{bat} \quad \text{[Equation 3]}$$

In Equation 3, $V_{out}$ denotes the output voltage of the operational amplifier 340, $V_{bat}$ denotes the voltage of the battery 310, $V_{cc}$ denotes the voltage of the external power source 336, $R_1$ denotes the first resistance 331, $R_2$ denotes the second resistance 332, $R_3$ denotes the third resistance 333, $R_4$ denotes the fourth resistance 334, $R_5$ denotes the fifth resistance 335, and $R_{pre}$ denotes the auxiliary resistance 324. In one example, the voltage of the battery 310 is the same as the voltage of the external power source 336, and the output voltage $V_{out}$ of the operational amplifier 340 is expressed by Equation 4 below.

$$V_{out} = \left\{ \frac{(R_1+R_2) \times R_4}{R_1 \times (R_3+R_4)} - \frac{R_2 \times R_5}{R_1 \times (R_{pre}+R_5)} \right\} \times V_{bat} \quad \text{[Equation 4]}$$

In Equation 4, $V_{out}$ denotes the output voltage of the operational amplifier 340, $V_{bat}$ denotes the voltage of the battery 310, $R_1$ denotes the first resistance 331, $R_2$ denotes the second resistance 332, $R_3$ denotes the third resistance 333, $R_4$ denotes the fourth resistance 334, $R_5$ denotes the fifth resistance 335, and $R_{pre}$ denotes the auxiliary resistance 324.

Figure 3E:
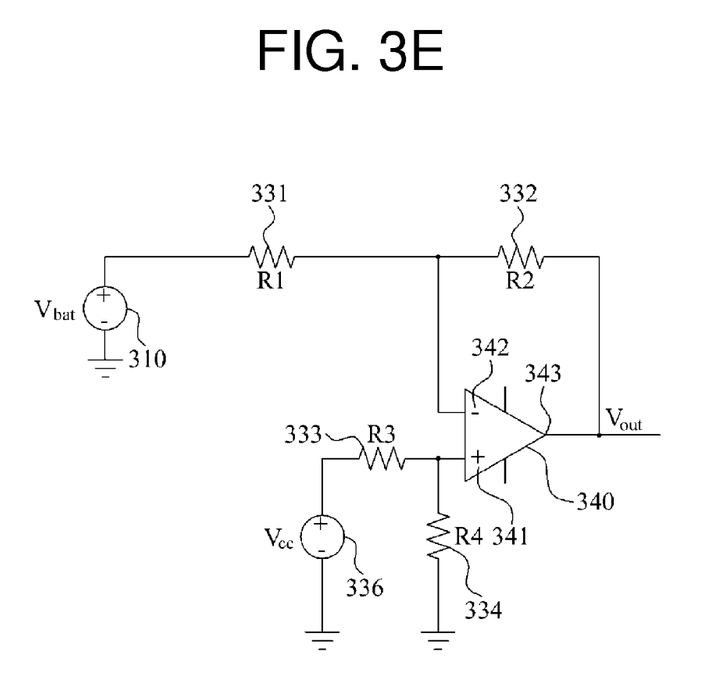

When the first relay 321 and the second relay 322 are in an ON-state and the third relay 323 is in an OFF-state, the operational amplifier 340 and the plurality of resistances including the first resistance 331, the second resistance 332, the third resistance 333, the fourth resistance 334, and the fifth resistance 335 of the voltage outputter 330 have an equivalent circuit as shown in FIG. 3E. In this example, a voltage of the battery 310 is connected to the voltage outputter 330 and the battery 310 and the fifth resistance 335 are connected in parallel. Accordingly, the voltage of the battery 310 and the voltage of the external power source 336 are applied to the first resistance 331, the second resistance 332, the third resistance 333, and the fourth resistance 334. The operational amplifier 340 outputs a differential voltage between a voltage applied to the fourth resistance 334 and a voltage applied to the second resistance 332. When the first relay 321 and the second relay 322 are in an ON-state and the third relay 323 is in an OFF-state, the output voltage $V_{out}$ of the operational amplifier 340 is expressed by Equation 5 below.

$$V_{out} = \frac{(R_1+R_2)R_4}{R_1(R_3+R_4)} V_{CC} - \frac{R_2}{R_1} V_{bat} \quad \text{[Equation 5]}$$

In Equation 5, $V_{out}$ denotes the output voltage of the operational amplifier 340, $V_{bat}$ denotes the voltage of the battery 310, $V_{cc}$ denotes the voltage of the external power source 336, $R_1$ denotes the first resistance 331, $R_2$ denotes the second resistance 332, $R_3$ denotes the third resistance 333, and $R_4$ denotes the fourth resistance 334. In one example, the voltage of the battery 310 is the same as the voltage of the external power source 336, and the output voltage $V_{out}$ of the operational amplifier 340 is by Equation 6 below.

$$V_{out} = \left\{ \frac{(R_1+R_2) \times R_4}{R_1 \times (R_3+R_4)} - \frac{R_2}{R_1} \right\} \times V_{bat} \quad \text{[Equation 6]}$$

In Equation 6, $V_{out}$ denotes the output voltage of the operational amplifier 340, $V_{bat}$ denotes the voltage of the battery 310, $R_1$ denotes the first resistance 331, $R_2$ denotes the second resistance 332, $R_3$ denotes the third resistance 333, and $R_4$ denotes the fourth resistance 334.

In one example, the battery system 330 further includes a voltage transmitter (not shown). The voltage transmitter transmits to the controller 350 the voltage output from the voltage outputter 330. The voltage transmitter is connected between the voltage outputter 330 and the controller 350. The voltage transmitter adjusts the voltage output from the voltage outputter 330 to be a voltage that can be input to the controller 350. For example, when a voltage of 5V or less can be input to the controller 350, a voltage output from the voltage outputter 330 may exceed 5V. In this example, the voltage transmitter includes a voltage regulator to convert the voltage output from the voltage outputter 330 to be 5V or less. For example, when the voltage outputter 330 outputs voltages of 15V, 12V, 9V, and 6V based on the states of the first relay 321, the second relay 322, and the third relay 323, the voltage transmitter adjusts the voltages of 15V, 12V, 9V, and 6V output from the voltage outputter 330 to be 5V, 4V, 3V, and 2V, respectively.

The controller 350 determines whether each of the plurality of relays including the first relay 321, the second relay 322, and the third relay 323 is welded based on the voltage output from the voltage outputter 330. For example, the controller 350 determines whether one or more of the first relay 321, the second relay 322, and the third relay 323 is in a welded state by comparing the voltage output from the voltage outputter 330 to predetermined reference information. In one example, the controller 350 includes a micro controller unit (MCU).

For example, as described above, when the first relay 321, the second relay 322, and the third relay 323 are in an OFF-state, the output voltage $V_{out}$ of the operational amplifier 340 is expressed by Equation 1 above. This output voltage $V_{out}$ may be stored as first predetermined reference information, and the output voltage $V_{out}$ of the operational amplifier 340 may be compared to the first predetermined reference information when the first relay 321, the second relay 322, and the third relay 323 are in an OFF-state. If none of the first relay 321, the second relay 322, and the third relay 323 is welded, the output voltage $V_{out}$ of the operational amplifier 340 will be equal to the first predetermined reference information. However, if one or more of the first relay 321, the second relay 322, and the third relay 323 are welded, the output voltage $V_{out}$ of the operational amplifier 340 will not be equal to the first predetermined reference information, and it may be determined that one or more of the first relay 321, the second relay 322, and the third relay 323 are welded.

Similarly, the output voltage $V_{out}$ of the operational amplifier 340 expressed by Equation 2 when the second relay 322 is in an ON-state and the first relay 321 and the third relay 323 are in an OFF-state above may be stored as second predetermined reference information; the output voltage $V_{out}$ of the operational amplifier 340 expressed by Equation 3 or 4 above when the second relay 322 and the third relay 323 are in an ON-state and the first relay 321 is in an OFF-state may be stored as third predetermined reference information, and the output voltage $V_{out}$ of the operational amplifier 340 expressed by Equation 5 or 6 above when the first relay 321 and the second relay 322 are in an ON-state and the third relay 323 is in an OFF-state may be stored as fourth predetermined reference information.

Figure 4:
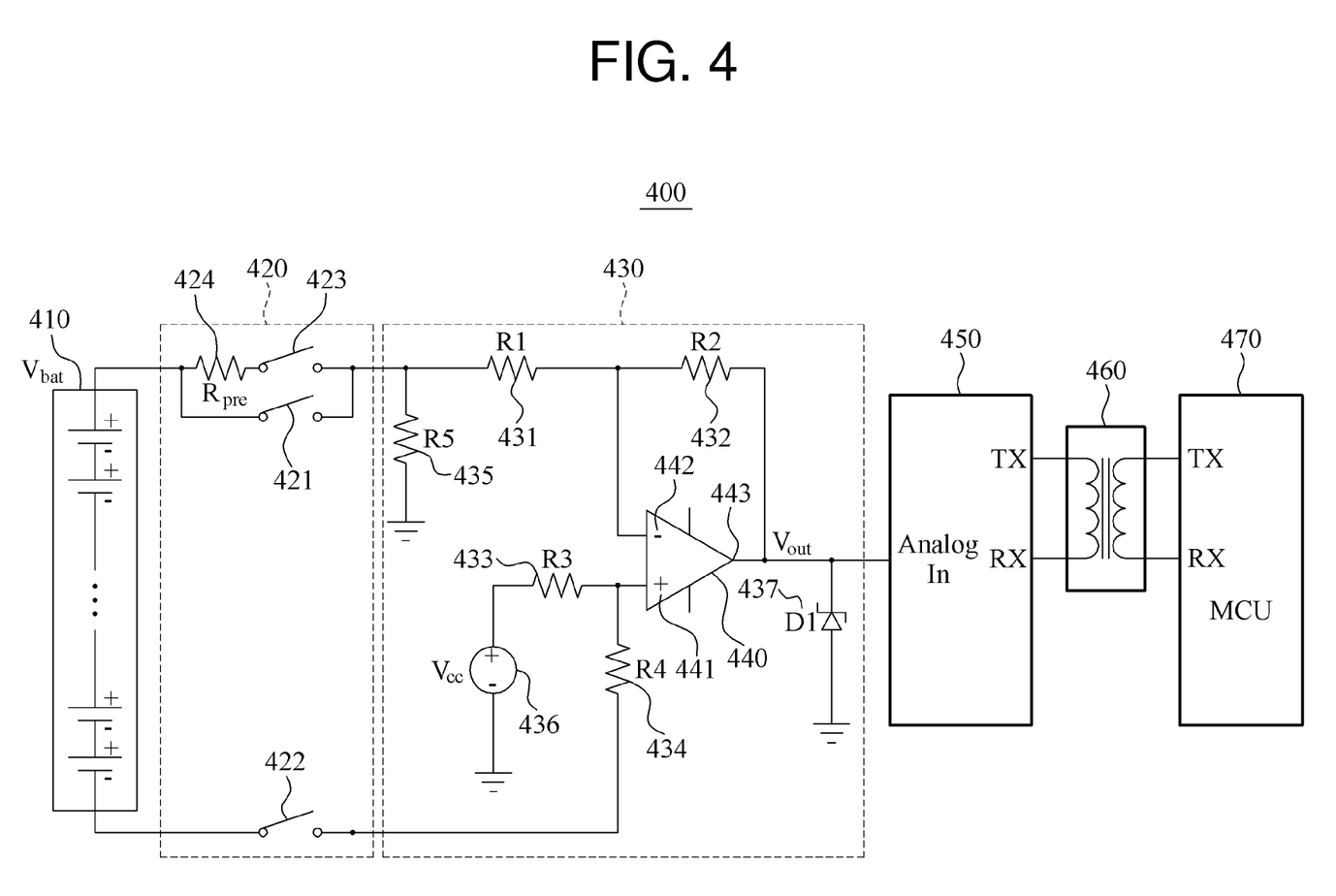
FIG. 4 illustrates another example of a battery control apparatus.

FIG. 4 illustrates another example of a battery control apparatus.

Referring to FIG. 4, a battery system 400 includes a battery 410, a relay apparatus 420, a voltage outputter 430, a voltage transmitter 450, an isolator 460 (for example, an isolation transformer or an opto-isolator), and a controller 470. In one example, the voltage outputter 430, the voltage transmitter 450, the isolator 460, and the controller 470 are included in the battery control apparatus.

The relay apparatus 420 switches a connection between the battery 410 and a load (not shown). That is, the relay apparatus 420 connects the battery 410 to the load, and disconnects the battery 410 from the load. The relay apparatus 420 includes a first relay 421, a second relay 422, and a third relay 423. The first relay 421 is connected to an anode of the battery 410, and the second relay 422 is connected to a cathode of the battery 410. The third relay 423 is connected in series with an auxiliary resistance 424, and the series-connected third relay 423 and auxiliary resistance 424 are connected in parallel with the first relay 421. The auxiliary resistance 424 is connected between the anode of the battery 410 and the third relay 423.

The voltage outputter 430 includes an operational amplifier 440 and a plurality of resistances including a first resistance 431, a second resistance 432, a third resistance 433, a fourth resistance 434, and a fifth resistance 435. In one example, the first resistance 431 is connected between an inverting terminal 442 of the operational amplifier 440 and a point where the first relay 421 and the third relay 423 are connected to each other, the second resistance 432 is connected between the inverting terminal 442 and an output terminal 443 of the operational amplifier 430, and the third resistance 433 is connected between a non-inverting terminal 441 of the operational amplifier 440 and an external power source 436. The fourth resistance 434 is connected between the second relay 422 and the non-inverting terminal 441, and the fifth resistance 435 is connected between a ground and a point where the first relay 421, the third relay 423, and the first resistance 431 are connected to each other. A voltage value of the external power source 436 may be equal to a voltage value of the battery 410.

The voltage outputter 430 outputs a voltage having a different voltage value for each state of each of the first relay 421, the second relay 422, and the third relay 423. The voltage output from the voltage outputter 430 is input to the voltage transmitter 450. In this example, a voltage adjuster 437 adjusts the voltage output from the voltage outputter 430 to be a voltage that can be input to the voltage transmitter. For example, when the voltage outputter 430 outputs voltages of 6V, 4V, 2V, and 1V based on the states of the first relay 421, the second relay 422, and the third relay 423, and when a voltage of 5V or less can be input to the voltage transmitter 450, the voltage adjuster 437 drops the voltage of 6V to 5V using a Zener diode D1. Accordingly, the voltage transmitter 450 receives voltages of 5V, 4V, 2V, and 1V based on the states of the first relay 421, the second relay 422, and the third relay 423.

The voltage transmitter 450 transmits to the controller 470 the voltage output from the voltage outputter 430 as adjusted by the voltage adjuster 437. In one example, the voltage transmitter 450 is connected to the battery 410 and may be a high voltage device, while the controller 470 may be a low voltage device. In this example, when the voltage transmitter 450 transmits to the controller 470 the voltage output from the voltage outputter 430, an error according to a voltage transmission may occur. For example, when the voltage transmitter 450 transmits to the controller 470 data including information on the voltage output from the voltage outputter 430 in a state in which the voltage transmitter 450 and the controller 470 are not electrically isolated from each other, a potential of a ground (not shown) to which the controller 470 is grounded may fluctuate. Due to the fluctuation of the potential of the ground, an error may occur in data transmitted from the voltage transmitter 450, and the controller 470 may not receive the voltage output from the voltage outputter 430 as adjusted by the voltage adjuster 437. To prevent this, the isolator 460 is disposed between the voltage transmitter 450 and the controller 470 to electrically isolate the voltage transmitter 450 and the controller 470 from each other. When the voltage transmitter 450 and the controller 470 are electrically isolated from each other by the isolator 460, the voltage transmitter 450 is able to transmit to the controller 470 the voltage output from the voltage outputter 430 as adjusted by the voltage adjuster 437.

The controller 470 determines whether each of the first relay 421, the second relay 422, and the third relay 423 is welded based on the voltage output from the voltage outputter 430. In one example, the controller 470 includes a micro controller unit (MCU).

Figure 5:
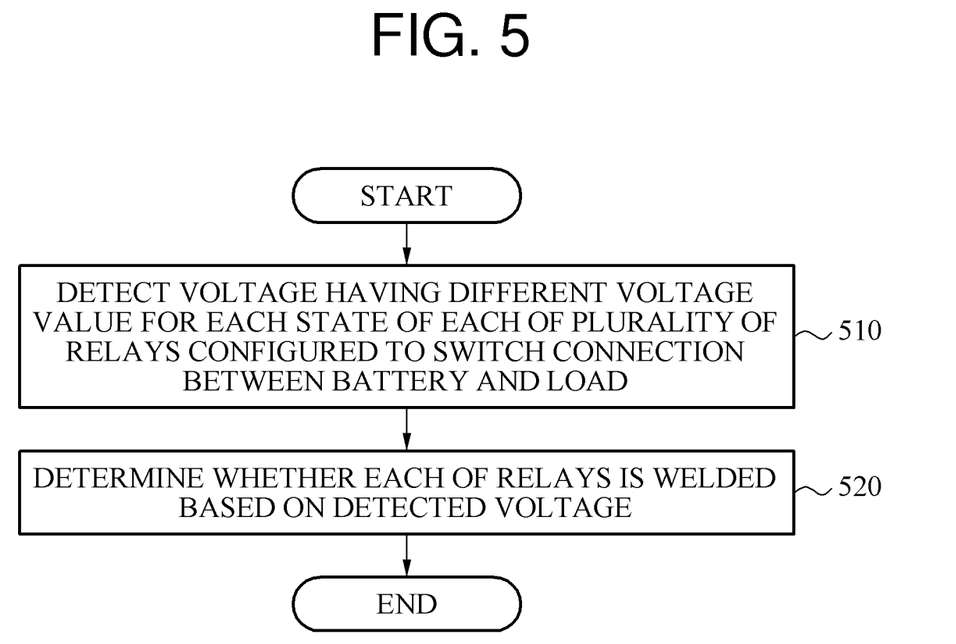
FIG. 5 illustrates an example of a method of detecting a state of a relay.

FIG. 5 illustrates an example of a method of detecting a state of a relay.

Referring to FIG. 5, in operation 510, a battery control apparatus detects a voltage having a different voltage value for each state of each of a plurality of relays configured to switch a connection between a battery and a load, that is, to connect the battery to the load, and disconnect the battery from the load. In one example, the plurality of relays include a first relay connected to an anode of the battery, a second relay connected to a cathode of the battery, and a third relay connected in series with an auxiliary resistance, with the series-connected third relay and auxiliary resistance being connected in parallel with the first relay.

In operation 520, the battery control apparatus determines whether each of the relays is welded based on the detected voltage. In one example, the battery control apparatus determines whether each of the relays is welded by comparing the detected voltage to predetermined reference information.

The description provided above with reference to FIGS. 1 through 4 is also applicable to the relay state detecting method of FIG. 5, and thus a further detailed description will be omitted.

The controller 250 in FIG. 2, the controller 350 in FIG. 3, and the controller 470 in FIG. 4 that determine whether each of a plurality of relays is welded based on the voltage output from the voltage outputters 240, 330, and 430, respectively, as shown in FIG. 5 and the voltage transmitter 450 in FIG. 4 that transmits the voltage output from the voltage outputter 430 to the controller 470 via the isolator 460 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for detecting a state of a relay, the apparatus comprising:
   a voltage outputter configured to output a voltage having a different voltage value for each state of each of a plurality of relays configured to switch a connection between a battery and a load;
   a controller configured to determine whether each of the plurality of relays is welded based on the voltage output from the voltage outputter; and
   a voltage transmitter configured to transmit the voltage output from the voltage outputter to the controller and to adjust the voltage output from the voltage outputter to be a voltage that can be input to the controller,
   wherein the plurality of relays comprise:
   a first relay connected to an anode of the battery;
   a second relay connected to a cathode of the battery; and
   a third relay connected in series with an auxiliary resistance, with the series-connected third relay and auxiliary resistance being connected in parallel with the first relay,
   wherein the voltage outputter comprises:
   an operational amplifier; and
   a plurality of resistances connected to an inverting terminal and a non-inverting terminal of the operational amplifier, and
   the voltage outputter is further configured to output the voltage from an output terminal of the operational amplifier,
   wherein the plurality of resistances comprises:
   a first resistance connected between the inverting terminal and a point where the first relay and the third relay are connected to each other;

a second resistance connected between the inverting terminal and the output terminal of the operational amplifier;
a third resistance connected between the non-inverting terminal and an external power source;
a fourth resistance connected between the second relay and the non-inverting terminal; and
a fifth resistance connected between a ground and a point where the first relay, the third relay, and the first resistance are connected to each other.

2. The apparatus of claim 1, wherein the voltage outputter is further configured to:
apply a voltage of the external power source to the first resistance, the second resistance, and the fifth resistance in response to the first relay through the third relay being in an OFF state; and
output, from the output terminal of the operational amplifier, a differential voltage between the voltage of the external power source and a voltage applied to the second resistance.

3. The apparatus of claim 1, wherein the voltage outputter is further configured to:
apply a voltage of the external power source to the first through fifth resistances in response to the second relay being in an OFF state; and
output, from the output terminal of the operational amplifier, a differential voltage between a voltage applied to the fourth resistance and a voltage applied to the second resistance.

4. The apparatus of claim 1, wherein the voltage outputter is further configured to:
apply a voltage of the battery and a voltage of the external power source to the first through fifth resistances and the auxiliary resistance in response to the second relay and the third relay being in an ON-state and the first relay being in an OFF-state; and
output, from the output terminal of the operational amplifier, a differential voltage between a voltage applied to the fourth resistance and a voltage applied to the second resistance.

5. The apparatus of claim 1, wherein the voltage outputter is further configured to:
apply a voltage of the battery and a voltage of the external power source to the first through fourth resistances in response to the first relay and the second relay being in an ON-state and the third relay being in an OFF-state; and
output, from the output terminal of the operational amplifier, a differential voltage between a voltage applied to the fourth resistance and a voltage applied to the second resistance.

6. The apparatus of claim 1, wherein a voltage value of the external power source is equal to a voltage value of the battery.

7. The apparatus of claim 1, further comprising an isolator configured to electrically separate the voltage transmitter and the controller from each other;
wherein the voltage transmitter is further configured to transmit the voltage output from the voltage outputter to the controller via the isolator.

8. The apparatus of claim 1, wherein the controller is further configured to determine whether each of the plurality of relays is welded by comparing the voltage output from the voltage outputter to predetermined reference information.

9. The apparatus of claim 1, wherein the controller is further configured to control each of the plurality of relays to switch a connection between each of the plurality of relays and the voltage outputter; and
the voltage outputter is further configured to output the voltage having the different voltage value for each state of each of the plurality of relays based on the connection between each of the plurality of relays and the voltage outputter.

10. The apparatus of claim 1, wherein the controller is further configured to transmit information on a welding state of each of the plurality of relays outside the apparatus.

11. The apparatus of claim 1, wherein the state of each of the plurality of relays includes an ON-state and an OFF-state.

12. The apparatus of claim 1, wherein the state of each of the plurality of relays includes a state where all of the plurality of relays are in an OFF-state.

13. The apparatus of claim 1, wherein the voltage outputter is configured to output the voltage regardless of whether all of the plurality of relays are in an OFF-state.

14. A method of detecting a state of a relay, the method comprising:
detecting a voltage having a different voltage value for each state of each of a plurality of relays configured to switch a connection between a battery and a load;
transmitting the detected voltage to a controller;
determining whether each of the plurality of relays is welded based on the detected voltage; and
adjusting the voltage output from the voltage outputter to be a voltage that can be input to the controller,
wherein the plurality of relays comprise:
a first relay connected to an anode of the battery;
a second relay connected to a cathode of the battery; and
a third relay connected in series with an auxiliary resistance, with the series-connected third relay and auxiliary resistance being connected in parallel with the first relay,
wherein the voltage outputter comprises:
an operational amplifier; and
a plurality of resistances connected to an inverting terminal and a non-inverting terminal of the operational amplifier, and
the voltage outputter is further configured to output the voltage from an output terminal of the operational amplifier,
wherein the plurality of resistances comprises:
a first resistance connected between the inverting terminal and a point where the first relay and the third relay are connected to each other;
a second resistance connected between the inverting terminal and the output terminal of the operational amplifier;
a third resistance connected between the non-inverting terminal and an external power source;
a fourth resistance connected between the second relay and the non-inverting terminal; and
a fifth resistance connected between a ground and a point where the first relay, the third relay, and the first resistance are connected to each other.

15. The method of claim 14, wherein the determining comprises determining whether each of the plurality of relays is welded by comparing the detected voltage to predetermined reference information.

16. A non-transitory computer-readable storage medium storing a program comprising instructions to cause a computer to perform the method of claim 14.

* * * * *